United States Patent [19]
Kobatake

[11] Patent Number: 6,097,630
[45] Date of Patent: Aug. 1, 2000

[54] NON-VOLATILE SEMICONDUCTOR STORAGE DEVICE SELECTING BIT LINES ON VOLTAGE DIVIDED FROM WORD LINE SELECTION VOLTAGE

[75] Inventor: Hiroyuki Kobatake, Tokyo, Japan

[73] Assignee: NEC Corporation, Tokyo, Japan

[21] Appl. No.: 09/265,902

[22] Filed: Mar. 11, 1999

[30]     Foreign Application Priority Data

Mar. 11, 1998   [JP]   Japan ................................. 10-059476

[51] Int. Cl.[7] ................................................. G11C 16/04
[52] U.S. Cl. ............................... 365/185.18; 365/185.23; 365/230.01
[58] Field of Search ......................... 365/185.18, 185.23, 365/230.01

[56]             References Cited

U.S. PATENT DOCUMENTS

| | | | |
|---|---|---|---|
| 4,578,777 | 3/1986 | Fang et al. ............................. | 365/184 |
| 5,428,568 | 6/1995 | Kobayashi et al. ..................... | 365/185 |
| 5,495,453 | 2/1996 | Wociechowski et al. ......... | 365/185.18 |
| 5,517,453 | 5/1996 | Strain et al. ....................... | 365/185.12 |

*Primary Examiner*—David Nelms
*Assistant Examiner*—Connie C. Yoha
*Attorney, Agent, or Firm*—Foley & Lardner

[57]                ABSTRACT

A non-volatile semiconductor storage device has a plurality of non-volatile memory cells formed by cell transistors in which a first voltage is applied to a word line through an address selection circuit and a second voltage lower than the first voltage is applied to the transistors through a selection line and/or a bit line. The voltage applied to the transistors is lower than that conventionally employed. Accordingly, a withstand voltage of the transistor can be reduced to decrease the occupied area of the transistors to realize higher integration.

10 Claims, 6 Drawing Sheets

| NODE | WRITING | COLLECTIVE ERASING | READING |
|---|---|---|---|
| SL | 0 V | VppL | 0 V |
| BL | "0" READING 0 V<br>"1" READING VppL | 0 V | 1 V (V$_R$) |
| WL | SELECTED VppH<br>NON-SELECTED 0 V | VppH | SELECTED V$_R$<br>NON-SELECTED 0 V |

NON-VOLATILE SEMICONDUCTOR STORAGE DEVICE SELECTING BIT LINES ON VOLTAGE DIVIDED FROM WORD LINE SELECTION VOLTAGE

BACKGROUND OF THE INVENTION (a) Field of the Invention

The present invention relates to a non-volatile semiconductor storage device such as flash EEPROM, more in particular to the non-volatile semiconductor storage device having a function of selecting a group of word lines.

(b) Description of the Related Art

Figure 1:
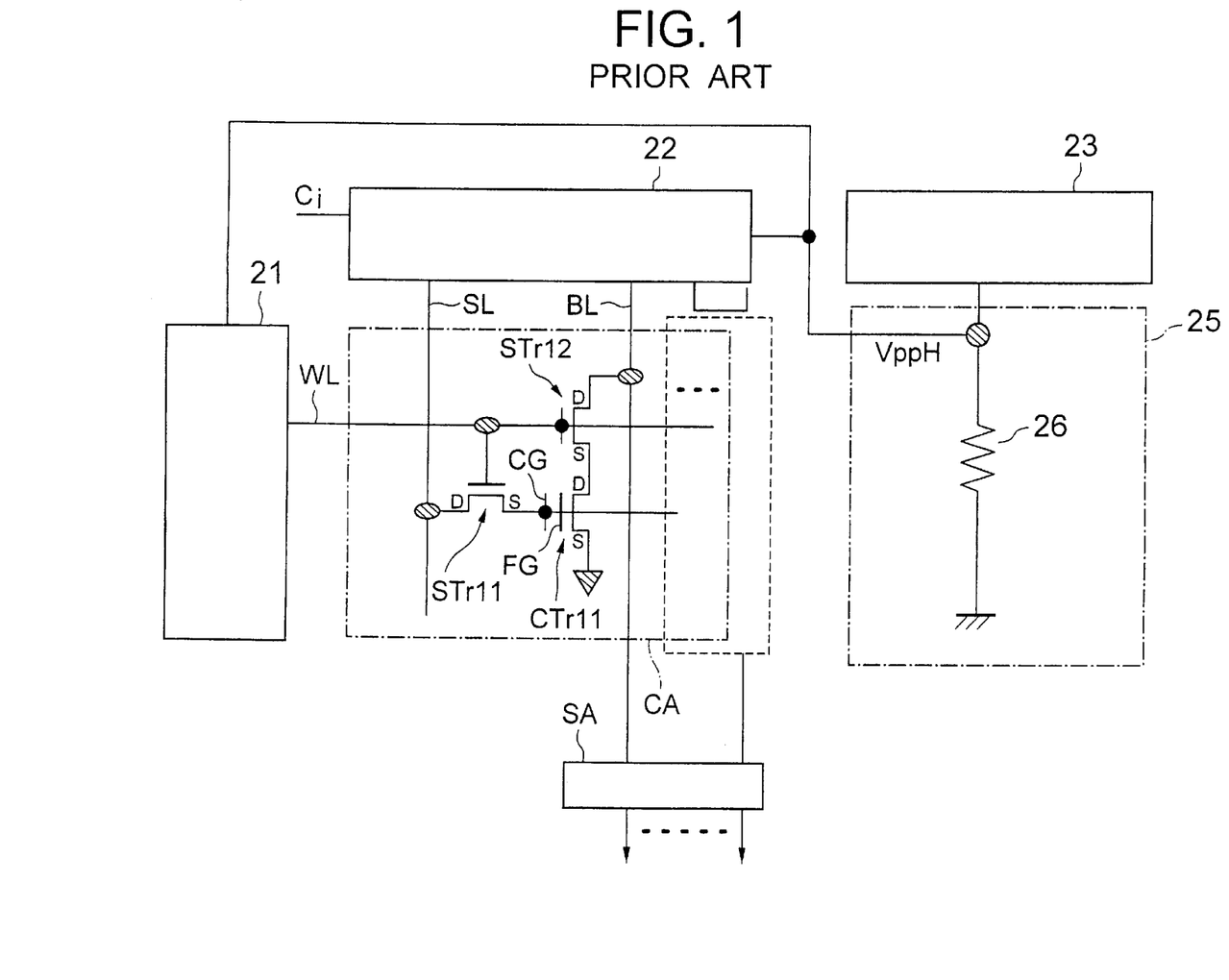
FIG. 1 is a circuit diagram showing a main part of a conventional EEPROM.

FIG. 1 is a circuit diagram showing a main part of a conventional EEPROM. This EEPROM has a plurality of non-volatile memory cells located at each intersection in the form of matrix formed by a plurality of word lines WL and a plurality of bit lines BL. The EEPROM has an X decoder 21 connected to each of the memory cells through the respective word lines WL extending in the row direction (horizontal direction in FIG. 1) and a column control circuit 22 connected to each of the memory cells through a selection line SL and the bit line BL perpendicular to the word line WL. The EEPROM further has a voltage establishing circuit 25 and a charge pump 23 providing a required voltage to the voltage establishing circuit 25.

A cell array CA has select transistors STr11 and STr12 and a cell transistor CTr11 constituting the memory cell. The word line WL is connected to each gate of the select transistors STr11 and STr12. The cell transistor CTr11 has a floating gate FG and a control gate CG. The select transistors STr11 and STr12 and the cell transistor CTr11 are formed by N-channel MOS transistors. The drain of the select transistor STr11 is connected to the selection line SL, and the source thereof is connected to the control gate CG of the cell transistor CTr11. The drain of the select transistor STr12 is connected to the bit line BL, and the source thereof is connected to the drain of the cell transistor CTr11.

Although an example is shown in FIG. 1 wherein one cell transistor CTr11 is connected to one select transistor STr11, generally a plurality of the cell transistors CTr11 are connected to one select transistor STr11 thereby enabling collective reading and writing of a plurality of the cell transistors CTr11 by the selection line SL. Therefore, one selection line SL and a plurality of the bit lines BL are connected to one cell array CA and the number of the bit lines are, for example, between 8 and 32.

The X decoder 21 has a function of selecting the word line WL in accordance with a supplied address signal. The selection line SL from the column control circuit 22 is selected in accordance with a supplied address signal. The bit line BL from the column control circuit 22 outputs a signal only in reading operation and writing operation, and the logic level of the signal is determined by the writing value. During the reading operation, a reading voltage VR (about 1 V) is applied to the output of the bit line BL of the column control circuit 22, and the stored information of the output of the memory cell is judged by a sense amplifier SA and externally outputted. The output of the sense amplifier SA may be further selected by a column selection signal obtained by decoding the address signal.

The voltage establishing circuit 25 has a load circuit 26. The voltage establishing circuit 25 detects a program voltage VppH (for example, about 18 V) supplied from the charge pump 23 as an output voltage, and stops the operation of the charge pump when the voltage rises over a prescribed voltage and restarts the operation of the charge pump when the voltage decreases below the prescribed voltage. The voltage establishing circuit 25 supplies the program voltage VppH to the X decoder 21 and the column control circuit 22.

Figure 2:
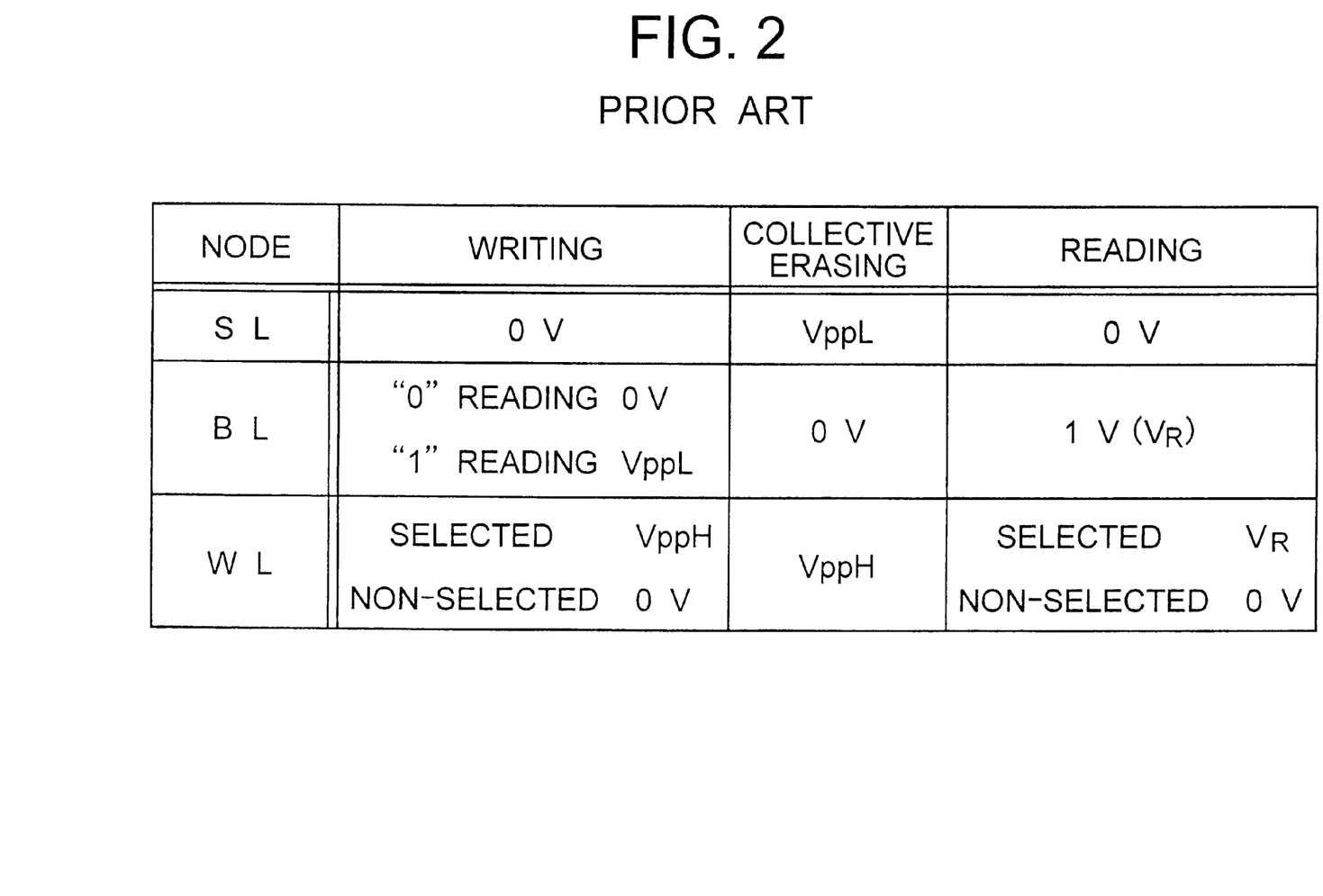
FIG. 2 is a table showing states of voltages applied to each node.

FIG. 2 is a table showing states of voltages applied to each of the nodes under the respective modes of writing, collective erasing and ordinary reading. The operation of the above conventional EEPROM is described in accordance with FIG. 2.

When "1") is written in the cell transistor CTr11, the select transistors STr11 and STr12 of the selected memory cell are turned on after each gate is biased to the program voltage VppH through the word line WL. Since the column control circuit 22 biases the drain of the select transistor STr11 to 0 V through the selection line SL, the control gate CG of the cell transistor CTr11 is biased to 0V. Since the column control circuit 22 simultaneously biases the drain of the select transistor STr12 to the program voltage VppH through the bit line BL, VppL (for example, about 15 V) obtained by subtracting a forward direction voltage drop from the program voltage VppH applied to the gate is applied to the source of the select transistor STr12. The drain of the cell transistor CTr11 is biased to the program voltage VppL, and the writing is performed by extracting electric charges from the floating gate FG. Since both of the selection line SL and the bit line BL are biased to 0V when the "0" is written in the cell transistor CTr11, the control gate CG and the drain of the cell transistor CTr11 become 0V. Accordingly, no electric charge is extracted from the floating gate FG and the erase state "0" is maintained. This is also applicable to the non-selected cell transistor CTr11.

When a plurality of the cell transistors CTr11 connected to one select transistor STr11 are collectively erased, the select transistors STr11 and STr12 in the selected memory cell are turned on by biasing each of the gates are biased to the program voltage VppH through the word lines WL. Since in this stage the column control circuit 22 biases the drain of the select transistor STr11 to the program voltage VppH through the selection line SL, the program voltage VppL is applied to the source of the select transistor STr11 in accordance with a similar principle. Thereby, the control gate of the cell transistor CTr11 is biased to the program voltage VppL. Since the column control circuit 22 biases the drain of the select transistor STr12 to 0V through the bit line BL, the drain of the cell transistor CTr11 is biased to 0V through the select transistor STr12. Thereby, electric charges are poured into the floating gate FG of the cell transistor CTr11 to perform the collective erasing. In the non-selected cell array CA, either of the selection line SL or the word line WL is 0V and the bit line BL is also 0V so that no erasing operation occurs.

Figure 3:
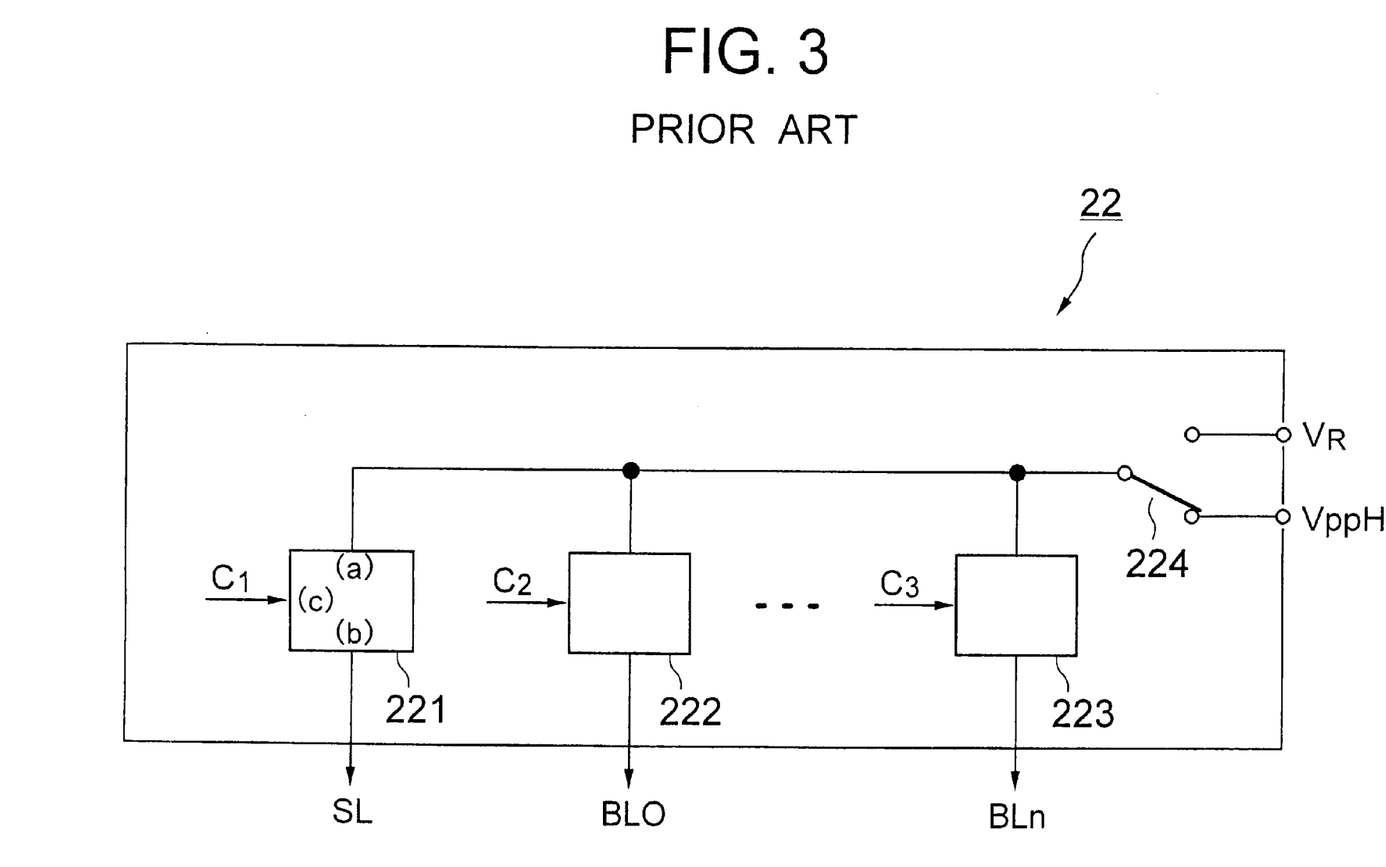
FIG. 3 is a block diagram showing a column control circuit in FIG. 1.

FIG. 3 is a block diagram showing the column control circuit 22 in detail. The column control circuit 22 is composed of a plurality of switching circuits 221 to 223 and a voltage changing switch 224 in FIG. 3. Each of the switching circuits 221 to 223 has terminals (a), (b) and (c). A power supply voltage $V_R$ or the program voltage VppH is supplied to the respective terminals (a). The respective terminals (b) are connected to the selection line SL, or the bit line BL0, BLn. Keying signals $C_1$ to $C_3$ for the switching circuits are inputted to the respective terminals (c). The voltage changing switch 224 changes the power supply voltage $V_R$ with the program voltage VppH or vice versa.

The keying signal $C_1$ controlling the selection line SL is a signal obtained by decoding an address signal supplied by a column control circuit (not shown). The keying signals $C_2$ and $C_3$ controlling the bit lines BL0 to BLn are logical product signals of a mode signal for a writing operation/an erasing operation and of a writing value or an erasing value. The terminal (b) outputs VppH/VR when the keying signals $C_1$ to $C_3$ are "1" and outputs 0V when the keying signals $C_1$ to $C_3$ are "0". The number of the switching circuits 222, 223 accommodated in one column control circuit 22 is determined by the constitution of the nonvolatile semiconductor storage. For example, the number is between 8 and 32, and amounts to several hundreds in the whole device.

Figure 4:
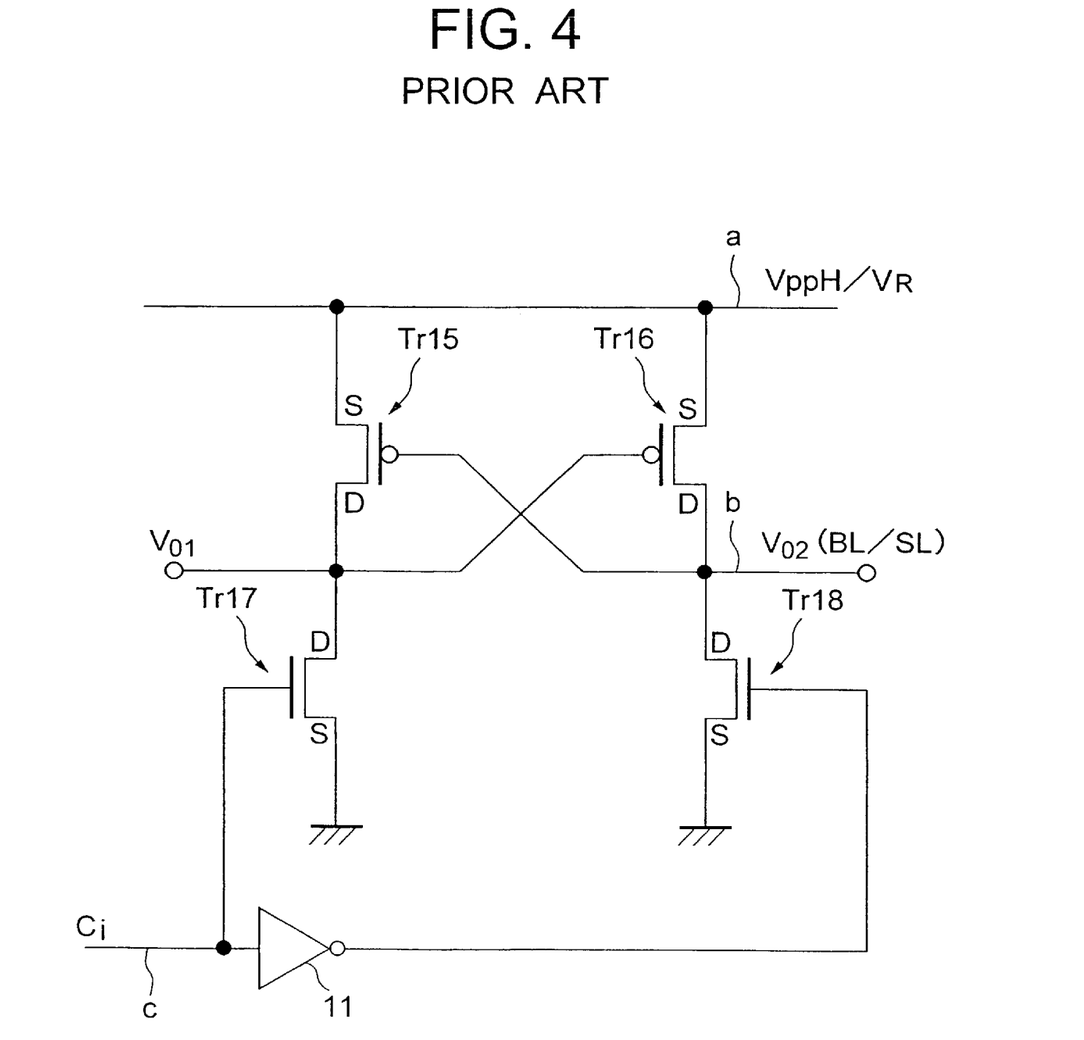
FIG. 4 is a detail circuit diagram showing a switching circuit in FIG. 3.

FIG. 4 is a detail circuit diagram showing the switching circuit 221 to 223. Each of the switching circuits 221 to 223 (FIG. 3) consists of transistors Tr15 and Tr16 which are P-channel MOS transistors (hereinafter referred to as PMOS transistor(s)), transistors Tr17 and Tr18 which are N-channel MOS transistors (hereinafter referred to as NMOS transistor (s)) and a complementary circuit (flip-flop circuit) having an inverter 11, and functions as a level shifter.

The transistor Tr15 has a source (terminal (a)) to which the power supply voltage $V_R$ or the program voltage VppH is supplied, a drain which is connected to a drain of the transistor Tr17 and a gate which is connected to a drain of the transistor Tr18. The transistor Tr16 has a source (terminal (a)) to which the power supply voltage $V_R$ or the program voltage VppH is supplied, a drain which is connected to the drain of the transistor Tr18 and a gate which is connected to the drain of the transistor Tr17. The transistor Tr17 has a grounded source and a gate which is connected to an input of the inverter 11. The transistor Tr18 has a grounded source and a gate which is connected to an output of the inverter 11. An output $V_{O1}$ is extracted from a common connection point among the drain of the transistor Tr15, the drain of the transistor TR17 and the gate of the transistor Tr16, and an output $V_{O2}$ is extracted from a common connection point (terminal (b)) among the drain of the transistor Tr16, the drain of the transistor TR18 and the gate of the transistor Tr15. A HIGH signal of 5V or a LOW signal of 0V is selectively inputted to the input Ci (terminal (c)) of the inverter.

The switching circuits 221 to 223 having the above constitutions operate as follows. When a HIGH signal is inputted to the input of the inverter 11 as a keying signal Ci, a HIGH signal is applied to the gate of the transistor Tr17 to turn on the transistor Tr17 and to make its drain ($V_{O1}$) LOW. A LOW signal is applied to the gate of the transistor Tr18 to turn off the transistor Tr18. Thereby, a LOW signal is applied to the gate of the transistor Tr16 to turn on the transistor Tr16 to make the drain ($V_{O2}$) of the transistor Tr16 HIGH. Simultaneously, a HIGH signal is applied to the gate of the transistor Tr15 to turn off the transistor Tr15. Thereby, the program voltage VppH is supplied to $V_{O2}$, and this program voltage VppH is extracted as an output $V_{O2}$.

When, on the other hand, a LOW signal is inputted to the input of the inverter 11 as the keying signal Ci, a HIGH signal is applied to the gate of the transistor Tr18 to turn on the transistor Tr18 and to make $V_{O2}$ LOW. A LOW signal is applied to the gate of the transistor Tr17 to turn off the transistor Tr17. Thereby, a LOW signal is applied to the gate of the transistor Tr15 to turn on the transistor Tr15 and to make $V_{O1}$ HIGH. As a result, a HIGH signal is applied to the gate of the transistor Tr16 to turn off the transistor Tr16 and to make $V_{O2}$ LOW. In this manner, $V_{O2}$ is selectively supplied to the selection line SL or the bit line BL of the selected cell array CA.

As mentioned, although the program voltage VppL is sufficient even for the higher voltage supplied to the cell transistor CTr11 in the conventional EEPROM, VppH higher than the program voltage VppL is supplied to the select transistors STr11 and STr12. Due to this, a transistor having a higher drain-source withstand voltage must be employed as the select transistors STr11 and STr12. Therefore, the drain-source distance increases to make the occupied areas of the select transistors STr11 and STr12 larger. Since the column control circuit 22 supplies the program voltage VppH higher than required to the respective drains of the select transistors STr11 and STr12, transistors having larger occupied areas must be employed to elevate withstand voltages so that a large-scale EEPROM must be used.

The four transistors Tr15 to Tr18 constituting the switching circuits 221 to 223 require a source-drain withstand voltage higher than the program voltage VppH. For example, since the transistors Tr15 and Tr18 turns on when the keying signal Ci is "0", the program voltage VppH is applied to the point between the source and the drain of the transistors Tr16 and Tr17. Vice versa, when the keying signal Ci is "1", the program voltage VppH is applied to the point between the source and the drain of the transistors Tr15 and Tr18. Accordingly, the respective source-drain withstand voltages of the above four transistors Tr15 to Tr18 are required to be higher than the program voltage VppH.

As mentioned, several hundreds of the switching circuits 221 to 223 exist in the whole device, and the number of the transistors Tr15 to Tr18 amounts to 1000 or more because it is four times as many as that of the switching circuits. Even if the occupied area increase per one transistor is slight, the large increase is produced in the whole device. It is a difficult problem how to reduce the area occupied by a large number of transistors.

It is known to relatively reduce a voltage applied to the column control circuit by forming a negative voltage power supply. However, in this instance, the number of auxiliary circuits increases. For example, a charge pump circuit generating a negative charge is required in addition to a charge pump circuit generating a positive charge, or a special circuit changing a positive voltage and a negative voltage is needed. Since, further, the positive voltage and the negative voltage are generated in the same transistor, the number of steps for manufacturing the transistor increases and the transistor must be designed considering the control of a voltage in a well region.

SUMMARY OF THE INVENTION

It is therefore an object of the present invention to provide a non-volatile semiconductor storage device enabling elevated integration by decreasing areas occupied by transistors.

The present invention provides a non-volatile semiconductor storage device having at least a plurality of non-volatile memory cells, in the form of matrix, formed by cell transistors containing a floating gate located at the respective intersections formed by a plurality of word lines and a plurality of bit lines operating at least in a writing mode for selected memory cells and in an erasing mode for a plurality of said memory cells comprising:

an address selection circuit supplied with a first voltage and applying a selection signal prepared from said first voltage to said word lines, a voltage establishing circuit establishing a second voltage lower than said first voltage by a prescribed voltage, a column control circuit supplied with said second voltage and selectively supplying a first signal prepared from said second voltage or a second signal prepared from a third voltage lower than said second voltage to a selected bit line.

Since, in the non-volatile semiconductor storage device, the voltage supplied to the column control circuit is established to be lower than that of a conventional non-volatile semiconductor storage device, a transistor, for example a MOS transistor employed in the column control circuit, may have a lower drain-source withstand voltage and a shorter channel length. Since the first signal and the second signal applied to the selected bit line are lower than the second voltage, a transistor, for example, a MOS transistor to which the signals are supplied, may have a lower drain-source withstand voltage and a shorter channel length. Thereby, the area occupied by the column control circuit and the like can be reduced to achieve further high integration of the non-volatile semiconductor storage device.

PREFERRED EMBODIMENTS OF THE INVENTION

Now, the present invention is more specifically described with reference to accompanying drawings. Embodiment 1

Figure 5:
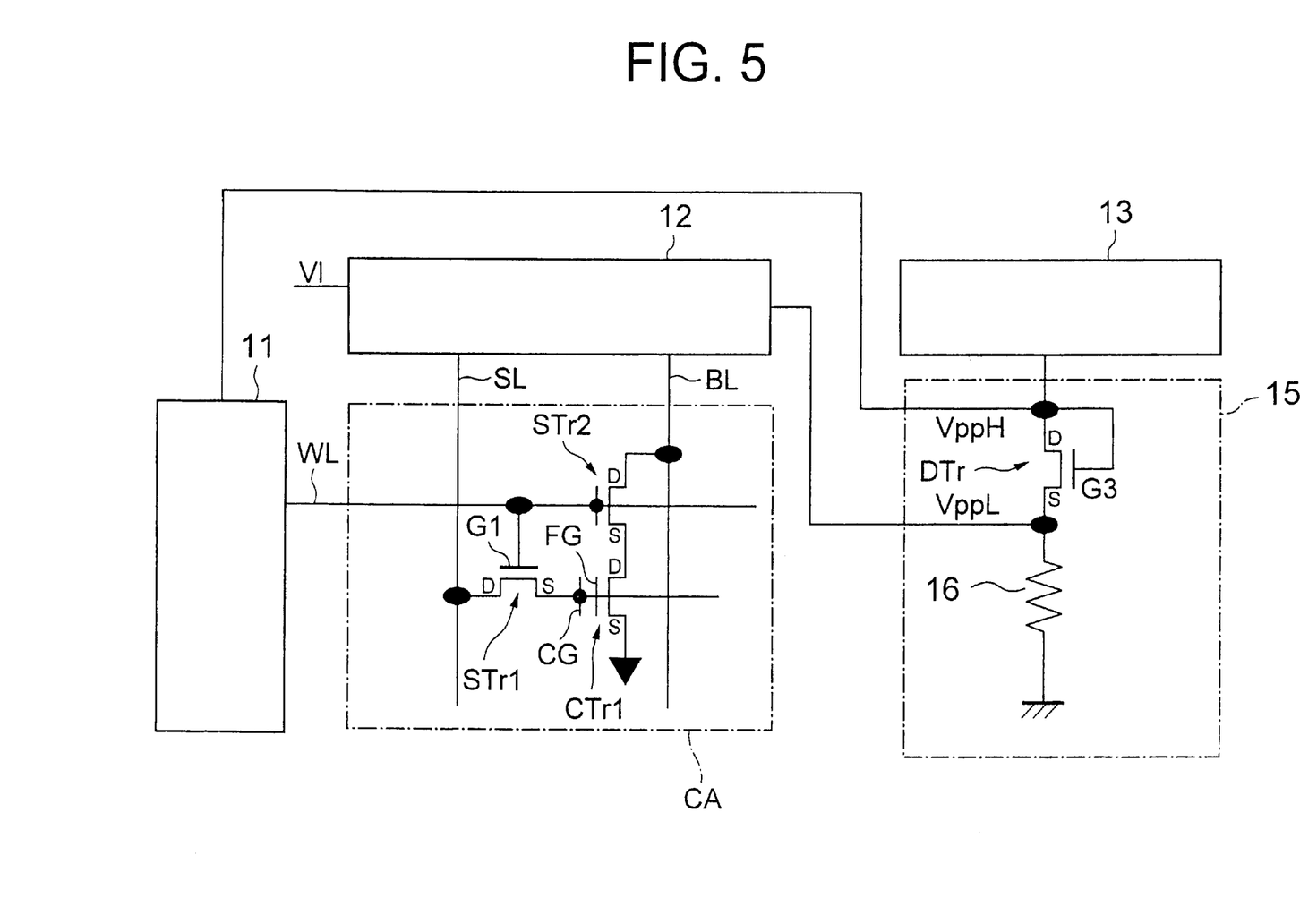
FIG. 5 is a circuit diagram showing a main part of EEPROM in accordance with an Embodiment of the present invention.

FIG. 5 is a circuit diagram showing a main part of EEPROM in accordance with an Embodiment of the present invention.

This EEPROM has a plurality of non-volatile memory cells in the form of matrix at each intersection formed by a plurality of word lines WL and a plurality of bit lines BL corresponding to one selection line SL. The EEPROM further has an X decoder (address selection circuit) 11, a column control circuit 12, a voltage establishing circuit 15 and a charge pump 13 supplying a required voltage to the voltage establishing circuit 15. The X decoder 11 is connected to the memory cells through the respective word lines WL extending in the row direction, and the column control circuit 12 is connected to the memory cells through the selection line SL and the bit line BL extending perpendicular to the word line WL.

Select transistors STr1 and STr2, and a cell transistor CTr1 having a floating gate FG and constituting the memory cell are arranged in a cell array CA. The word line WL is connected to the respective gates G1, G2 of the select transistors STr1 and STr2. The select transistors STr1 and STr2 are composed of NMOS transistors having threshold voltages nearly equal to each other. The select transistor STr1 has a drain connected to the selection line SL and a source connected to a control gate CG of the cell transistor CTr1. The select transistor STr2 has a drain connected to The bit line BL and a source connected to a drain of the cell transistor CTr1.

Although, in the present Embodiment, one cell transistor CTr1 is connected to one select transistor STr2, a plurality of cell transistors CTr1 may be connected to one select transistor STr1. Accordingly, one selection line SL and a plurality of the bit lines BL are connected to one column control circuit 12. A plurality of the column control circuits 12 are arranged in the row direction.

The voltage establishing circuit 15 has a division means composed of a voltage generation transistor DTr and a load circuit (constant current circuit) 16 connected with each other in the form of cascade connection. When a program voltage VppH (for example, about 18V) is supplied from the charge pump 13 as a first voltage, the voltage generation transistor DTr generates a program voltage VppL (for example, about 15V) as a second voltage lower than the first voltage by a prescribed voltage.

The voltage establishing circuit 15 detects the output voltages of the program voltages VppH and VppL employing the load circuit 16, and stops the operation of the charge pump when the output voltage exceeds a prescribed voltage and restarts the operation of the charge pump when the output voltage falls below the prescribed voltage. The voltage establishing circuit 15 supplies the program voltages VppH and VppL to the X decoder 11 and the column control circuit 12, respectively. The voltage generation transistor DTr is composed of an NMOS transistor having a threshold voltage similar to those of the select transistors STr1 and STr2.

The voltage generation transistor DTr of the present Embodiment utilizes the following basic principle. When the program voltage VppH is applied to the drain D in a so-called diode connection state in which the gate G3 and the drain D of the voltage generation transistor DTr is connected to each other, the program voltage VppL is outputted from its source S. This program voltage VppL is obtained by subtracting a forward direction voltage drop, or a threshold voltage Vth from the program voltage VppH.

The program voltage VppL is necessary for the writing or the erasing of the cell transistor CTr1 and is determined considering the physical properties of the cell transistors CTr1 and the writing time. The program voltage VppH is applied for turning-on of the select transistors STr1 and STr2. Since the voltage at the drain of the cell transistor CTr1, that is, at the sources of the select transistors STr1 and Str2 is the program voltage VppL, a voltage obtained by adding a threshold voltage Vth of the select transistors STr1 and STr2 to the program voltage VppL must be applied to the gate, otherwise the select transistors STr1 and STr2 are not turned on. In other word, the below inequality must be satisfied.

$$VppH \geq VppL + Vth$$

The X decoder 11 is a circuit for selecting a word line WL in accordance with an address signal, and produces a selection signal of selecting the word line WL from the program voltage VppH supplied from the voltage establishing circuit 15.

The column control circuit 12 having a unit formed by one selection line SL and a plurality of the bit lines BL corresponding to the selection line SL is located in every cell array CA column and produces, from the program voltage VppL and VR supplied from the voltage establishing circuit 15, a first signal and a second signal selectively applied to the selected selection line SL and bit line BL, respectively. The first signal is composed of the program voltage VppL which is the second voltage, and the second signal is composed of 0V which is a third voltage lower than the program voltage VppL.

In the EEPROM of the present Embodiment, the respective gates G1, G2 of the select transistors STr1 and STr2 in the selected memory cell are biased to the program voltage VppH through the word lines WL in the writing mode. Since, in this stage, the column control circuit 12 biases the drain of the select transistor STr1 to 0V through the selection line SL, the control gate CG of the cell transistor CTr1 is biased to 0V. Simultaneously, the column control circuit 12 biases the drain of the select transistor STr2 to the program voltage VppL through the bit line BL, and the select transistor STr2 is strongly turned on because the program voltage VppH is applied to its gate, and the drain of the cell transistor CTr1 is biased to the program voltage VppL. Thereby, the writing is performed after the extraction of electric charges stored in the floating gate FG. When "0" is written in the cell transistor CTr1, the voltages of the control gate CG and the drain of the cell transistor CTr1 becomes to 0V because the selection line SL is biased to 0V and the bit line BL is biased to 0V. No electric charge is extracted from the floating gate FG so that an erasing state "0" is maintained.

In the erasing mode, the respective gates G1 and G2 of the select transistors STr1 and STr2 added to the selected memory cell are biased to the program voltage VppH through the word line WL. Since, in this stage, the column control circuit 12 biases the drain of the select transistor STr1 to the program voltage VppL through the selection line SL, the control gate CG is biased to the program voltage VppL. Simultaneously, the column control circuit 12 biases the drain of the select transistor STr2 to 0V through the bit line BL so that the drain of the cell transistor CTr1 is biased to 0V. Thereby, the electric charges are poured into the floating gate FG to perform the collective erasing. In the non-selected cell array CA, either of the selection line SL or the word line WL is 0V, and the bit line BL is also 0V so that no erasing operation occurs.

The voltage establishing circuit 15 is not restricted to that composed of the voltage generation transistor DTr and the load circuit 16 as shown in FIG. 5, and those having other configurations shown in FIG. 6 can be employed.

Figure 6A:
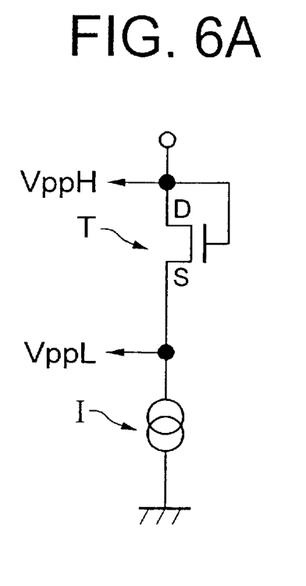
FIGS. 6A–6E each show an example of the voltage establishing circuits other than that shown in FIG. 5.
Figure 6B:
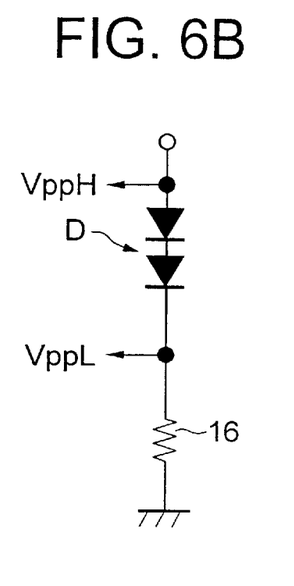

FIG. 6A shows an example employing a constant current source (constant current circuit) I in place of the load resistance 16 shown in FIG. 5. In this example, the division means is formed by the NMOS transistor having a gate and a drain connected with each other and the constant current source I. FIG. 6B shows another example in which the voltage generation transistor DTr in FIG. 5 is replaced with a plurality of diodes. In this example, the division means is formed by the diodes D and the load resistance 16.

Figure 6C:
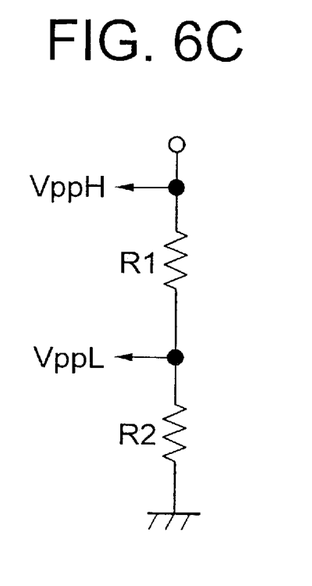

FIG. 6C shows a further example in which the voltage generation transistor DTr is replaced with a load R1 and an output voltage is determined by a division ratio between he load resistance R2 and the resistance R1. In this example, the division means is formed by a circuit having a plurality of the resistances R1, R2 connected in series.

Figure 6D:
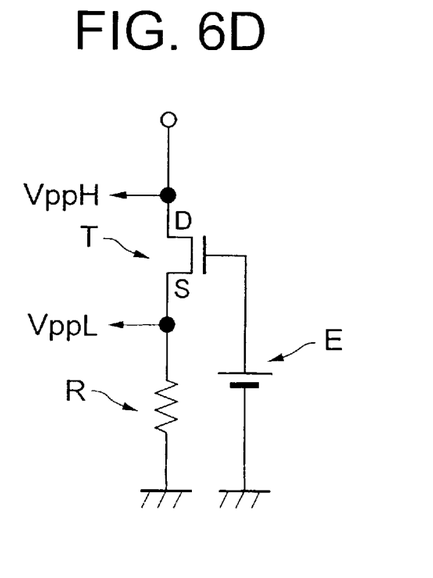
Figure 6E:
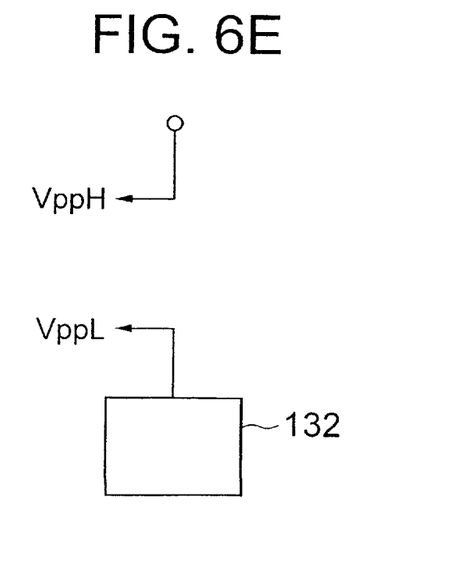

FIG. 6D shows a still further example in which the voltage establishing circuit is formed by a transistor T, a resistance R and a standard voltage source E. In this example, a voltage lower than the standard voltage source E by the threshold voltage Vth of the transistor T is obtained at the source of the transistor T. FIG. 6E shows a still further example of the voltage establishing circuit in which the program voltage VppL is supplied from another charge pump 132.

In the EEPROM of the present Embodiment, the transistor in the column control circuit 12 and the transistors STr1 and STr2 in the cell array CA operate at the program voltage VppL lower than that of a conventional EEPROM. Accordingly, the source-drain withstand voltages of the transistors in the column control circuit 12 and of the transistors STr1 and STr2 can be lower than that of a conventional EEPROM so that a consumption electric power can be reduced by the decrease of the voltage if operation currents are the same. Accordingly, an advantage such that a battery has a longer life is obtained. Since the channel length of the above transistors can be decreased to reduce the occupied area and the transistor size, further high integration can be realized. While the channel length of the transistor in the column control circuit 12 and of the transistors STr1 and STr2 in the cell array CA is about 7 micrometer in case that the drain voltage is equal to the program voltage VppH, the channel length thereof is about 5 micrometer in case that the drain voltage is equal to the program voltage VppL. Even if the occupied area reduction by one transistor is small, the area occupied by the transistors can be largely decreased in the whole device containing a plurality of the column control circuits.

As mentioned, since the voltages applied to the memory cells are similar to those conventionally employed, conventional memory cells may be employed without modification.

Since the above embodiments are described only for examples, the present invention is not limited to the above embodiments and various modifications or alternations can be easily made therefrom by those skilled in the art without departing from the scope of the present invention.

What is claimed is:

1. A non-volatile semiconductor storage device comprising:

a memory cell array including a plurality of non-volatile memory cells arranged in a matrix, each memory cell being located at respective intersections formed by a plurality of word lines and plurality of bit lines, each of said memory cells including a cell transistor having a floating gate, a first select transistor connected between a column select line and a control gate of said cell transistor, and a second select transistor connected between one of said bit lines and a voltage source, said first and second select transistors receiving a row select signal from said word line, said memory cell array operating at least in a writing mode for selected memory cells and in an erasing mode for a plurality of said memory cells, an address selection circuit for generating said row select signal having a first voltage, a voltage establishing circuit including a voltage generation transistor which has a drain connected to a gate thereof and maintained at said first voltage, for generating a second voltage lower than said first voltage by a source-drain voltage drop of said voltage generation transistor, and a column control circuit for generating said column select signal by selecting a first signal having said second voltage or a second signal having a third voltage lower than said second voltage, said first and second select transistors having a threshold voltage substantially equal to a threshold voltage of said voltage generation transistor.

2. The device as defined in claim 1, wherein said voltage establishing circuit has a division means for dividing said first voltage.

3. The device as defined in claim 2, wherein said division means comprises a MOS transistor having a gate and a drain connected with each other and a constant current circuit.

4. The device as defined in claim 2, wherein said division means comprises a circuit having a plurality of resistances connected in series.

5. The device as defined in claim 2, wherein said voltage establishing circuit includes a MOS transistor having a drain connected to said first voltage, a gate connected to a reference voltage and a source at which said second voltage is generated.

6. The device as defined in claim 1, wherein said column control circuit has a selection line connected to said control gates of the respective memory cells and applies said second signal to said selection line.

7. The device as defined in claim 6, wherein the respective memory cells have a first select transistor having a terminal connected to a current path of said selection line and the other terminal connected to said control gate, and a second select transistor having a terminal connected to a current path of said bit line and the other terminal connected to a current path of said cell transistor, both of said select transistors being operated in accordance with the selection of said word line.

8. The device as defined in claim 7, wherein said second signal is applied to said control gate through said first select transistor and said first signal is applied to said current path of said cell transistor through said second select transistor in a writing mode.

9. The device as defined in claim 7, wherein said first signal is applied to said control gate through said first select transistor and said second signal is applied to said current path of said cell transistor through said second select transistor in an erasing mode.

10. The device as defined in claim 2, wherein said division means comprises diodes and a constant current circuit.

* * * * *